United States Patent [19]

Baise et al.

[11] Patent Number: 4,507,333
[45] Date of Patent: Mar. 26, 1985

[54] BIPHENYLENE END-CAPPED QUINOXALINE POLYMERS AND THEIR USE AS INSULATING COATINGS FOR SEMICONDUCTOR DEVICES

[75] Inventors: Arnold I. Baise, Poughkeepsie, N.Y.; Anthony W. Wu, San Jose, Calif.

[73] Assignee: International Business Machines Corporation, Armonk, N.Y.

[21] Appl. No.: 443,251

[22] Filed: Nov. 22, 1982

[51] Int. Cl.³ .................. B05D 3/02; B05D 5/12; C08G 69/08; C07D 241/36
[52] U.S. Cl. ..................... 427/82; 252/576; 427/96; 427/389.7; 427/393.6; 428/426; 528/310; 544/353
[58] Field of Search ........... 427/82, 85, 96, 86, 427/389.7, 393.6; 252/575, 576; 428/426; 528/310; 544/353

[56] References Cited

U.S. PATENT DOCUMENTS

| | | | |
|---|---|---|---|
| 3,852,243 | 12/1974 | Hergenroth | 260/50 |
| 3,966,729 | 6/1976 | Kovar et al. | 260/250 Q |
| 4,022,746 | 5/1977 | Kovar et al. | 260/250 A |
| 4,125,725 | 11/1978 | Duffy | 544/353 |
| 4,147,868 | 4/1979 | Arnold et al. | 544/353 |

FOREIGN PATENT DOCUMENTS 131831 7/1978 German Democratic Rep. .

Primary Examiner—Michael R. Lusignan
Attorney, Agent, or Firm—Henry Powers

[57] ABSTRACT

An insulating or masking film for semiconductor devices formed by curing applied coatings of biphenylene end-capped quinoxaline polymers.

9 Claims, 1 Drawing Figure

U.S. Patent     Mar. 26, 1985     4,507,333
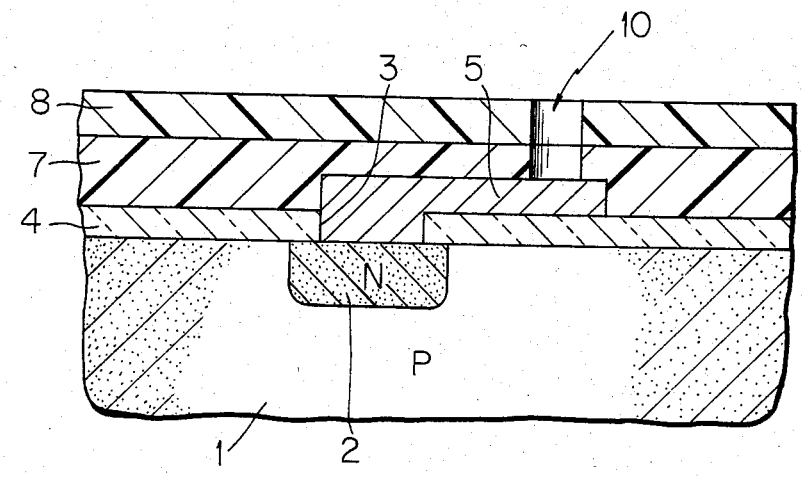

BIPHENYLENE END-CAPPED QUINOXALINE POLYMERS AND THEIR USE AS INSULATING COATINGS FOR SEMICONDUCTOR DEVICES

DESCRIPTION

Technical Field

This invention relates to insulating or masking coatings for semiconductor devices, and more in particular to forming such coatings from cured compositions of biphenylene end-capped quinoxaline prepolymers.

One object of this invention is to provide improved insulating and masking coatings for electronic components as for example, semiconductor component structures.

Another object of this invention is to provide new insulating and masking coatings for use on semiconductor components.

Another object of this invention is to provide an improved prepolymer of a biphenylene end-capped quinoxaline which can be used as insulating or masking coatings on electronic components, such as semiconductor integrated circuits.

Another object of the present invention is to provide cured biphenylene end-capped prepolymers on semiconductor structures such as integrated circuit devices and/or substrate carriers therefor.

Another object of the present invention is to provide cross-linked polymers of biphenylene end-capped quinoxaline compositions as coatings on semiconductor components.

Another object of the present invention is to provide biphenylene end-capped quinoxaline compositions which can be cured by addition reactions into cross-linked polymers.

Another object of the present invention is to provide a method for forming biphenylene end-capped quinoxaline compositions.

Another object of the present invention is to provide cross-linked polymers of biphenylene end-capped quinoxalines.

BACKGROUND ART

There is at present an increasing interest in the use of polymeric resins in the fabrication of electronic components such as semiconductor integrated circuits and/or supporting carriers therefor. Illustrative of such polymeric compositions are the polyimides, such as described in U.S. Pat. Nos. 3,684,592 and 3,700,497, whose properties have made them attractive of semiconductor devices or integrated circuits. These polyimides are condensation products of pyromellitic dianhydride and an aromatic diamine, characterized with properties which made them attractive for passivation of semiconductor devices, encapsulation thereof against contaminants in the ambient, and as masks for deposition of metallization in an interconnecting pattern between elements of an integrated circuit device. However, since these polyimide polymers are cross-linked, on curing by condensation reactions, the process is characterized by the evolution of volatiles which tend to form voids in the cured product which detracts from their suitability in application.

As a result, in recent development of new thermally stable polymers attention has been focused on materials which cure without evolution of volatiles. One such approach is to use an acetylene group as the curing site in quinoxaline polymers, some of which are described in U.S. Pat. Nos. 3,966,729, 4,022,746 and 4,147,868.

Another approach has been the incorporation of a biphenylene structure into the polymer chain, as discussed in A. Recca and J. K. Stille, Macromolecules 11, 479 (1978) and R. J. Swedo and C. S. Marvel, J. Poly. Sci. Chem. 17, 2815 (1979). The curing or cross-linking mechanism in this approach is believed to involve the formation of a biradical (II) when biphenylene (I) is heated to about 400° C. as follows

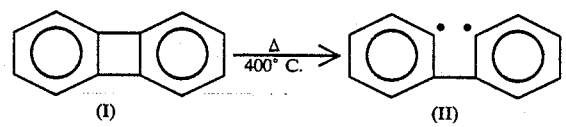

Previous applications of this approach have started with the biphenyl (I) followed by a Friedel-Crafts acylation:

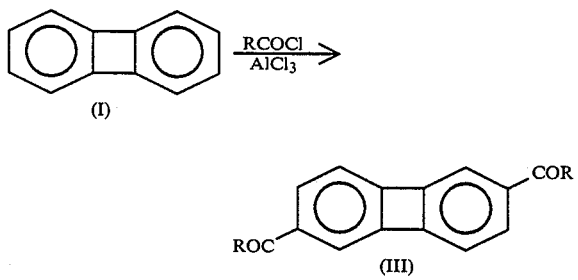

The substituted biphenylene (III) was then modified in various ways and subsequently incorporated in a polymer chain. Typical of the polymer chains are the quinoxaline polymers. However, the use of biphenylene poses a problem since it is difficult and dangerous to make.

Illustrative of other curable quinoxalines polymers or prepolymers are those discussed in U.S. Pat. Nos. 3,852,243 and 4,125,725.

BRIEF DESCRIPTION OF THE DRAWING

FIG. 1 is a fragmentary view in elevation of a semiconductor device for purposes of illustrating this invention.

DISCLOSURE OF THE INVENTION

It has been discovered, in accordance with this invention, that the biphenylene group can be incorporated in a polymer (e.g. quinoxaline) by end-capping the polymer with a 1,2-diketone (IV). These diketones can be prepared, as discussed by M. P. Cava et al, J. Am. Chem. Soc. 85 2076 (1963), in accordance with

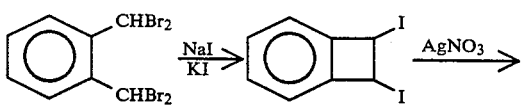

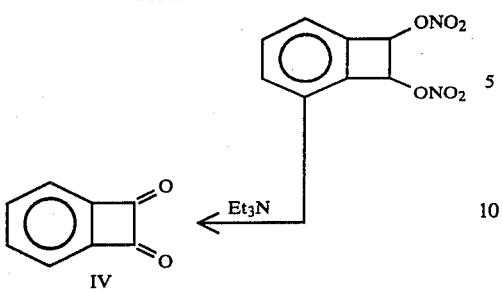

where Et₃N is triethylamine.

The diketone can then be reacted with orthodiamines (for example, quinoxalines) to give end-capped structures (V) as follows

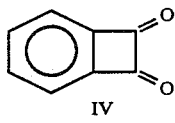

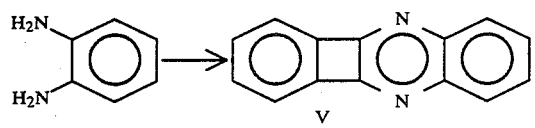

A specific application of this invention is in the use of benzocyclobutadienoquinone (IV) to prepare quinoxaline prepolymers containing the biphenylene terminal unit. These biphenylene units are incorporated at the ends of the chain. Previous quinoxaline polymers have had this biphenylene unit incorporated within the chain, see A. Recca et al noted above, where such synthesis involved the formation of biphenylene (I)

which was then converted to the 2,6-diglyoxalyldiphenylene dihydrate (VI):

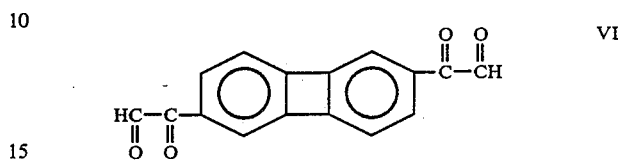

prior to the formation of the quinoxaline polymers.

The resultant end-capped polymer composition can be represented by the following structural formulas.

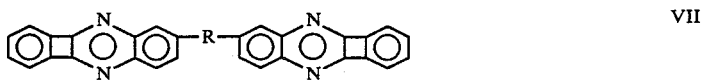

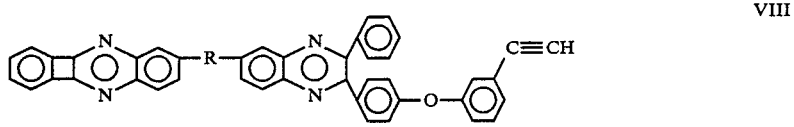

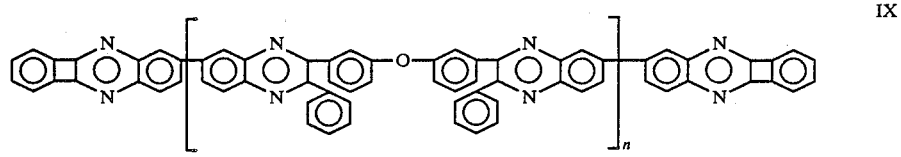

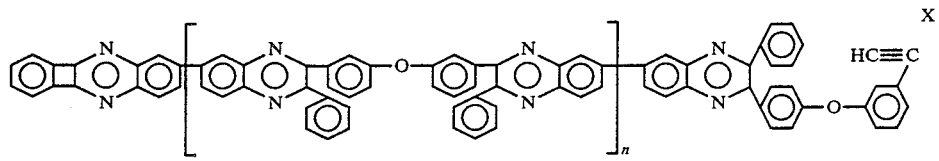

where R can be a direct bond, —O—, —S— or

and n is an integer from 1 to 20.

Structures (VIII) and (X) incorporate both biphenylene and acetylene curing sites, thus providing a two step curing process. Such a cure offers advantages in certain applications requiring multi-layer coatings of a cured product, where each applied layer of the prepolymer (e.g. structures (VIII) and (X)) need to be partially cured before subsequent layers are deposited. This was evidenced in DSC traces for structure (X) which showed exotherms at about 300° C. and at about 425° C., which can be attributed to the acetylene and biphenyl groups, respectively.

The biphenylene end-capped polymers are soluble in suitable solvents, such as N-methylpyrrolidone, and can be spun coated on substrates (e.g. semiconductor wafers) in conventional manner. The cured polymers also have good thermal stability by virtue of their aromatic structure, where for example, structure (X) showed only a 4% weight loss on heating to 500° C. in nitrogen.

These materials have potential application as organic insulators which can be cured without giving off water or other volatiles. As a result, they have application in the semiconductor fabrication art as thin film or masks either on chips or on ceramic and glass-ceramic substrates, or as thermally stable passivating layers.

DESCRIPTION OF PREFERRED EMBODIMENTS

EXAMPLE 1

Preparation of Benzocyclobutadienoquinone (IV)

Benzocyclobutadienoquinone (IV) was prepared as indicated below in accordance with published procedures as described by Cava et al noted above; Cava and Napier, J. Am. Chem. Soc., 79, 1701 (1957); Jensen and Coleman, J. Org. Chem., 23, 869 (1958); and Schmidt and Reid, Synthesis, 869 (1978):

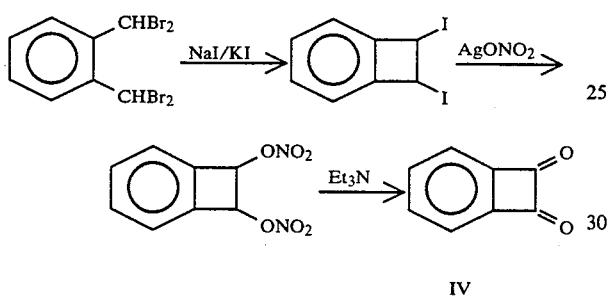

The diketone (IV) was purified by recrystallization from methylenechloride/hexane solution followed by sublimation under vaccum at 100° C.

EXAMPLE 2

Preparation of Biphenylene End-Capped Quinoxaline Prepolymer VII

These polymers are prepared in accordance with the following reaction:

where R is a direct bond, —O—, —S—, or

The preparation of this group of polymers is illustrated by the following specific example utilizing a three-necked round bottom flask fitted with a thermometer, an N$_2$ inlet and drying tube and a reflux condenser. In the flask was placed in solution with 50 ml. of tetrahydrofuran, 2.64 grams benzocyclobutadienoquinone (IV) and 2.14 grams of 3,3'-diaminobenzidine (XIA) having the structure

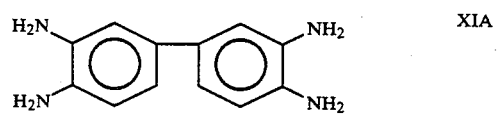

The mixture was brought to reflux for an hour. The product

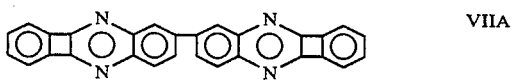

was isolated by pouring the tetrahydrofuran solution into 100 mls. MeOH (Methanol). The product was filtered, washed three times with MeOH, and dried under vacuum. The yield was better than 80%.

EXAMPLE 3

Preparation of Biphenylene and Acetylene End-capped Quinoxaline Prepolymers (VIII)

These prepolymers are prepared in accordance with the following reaction

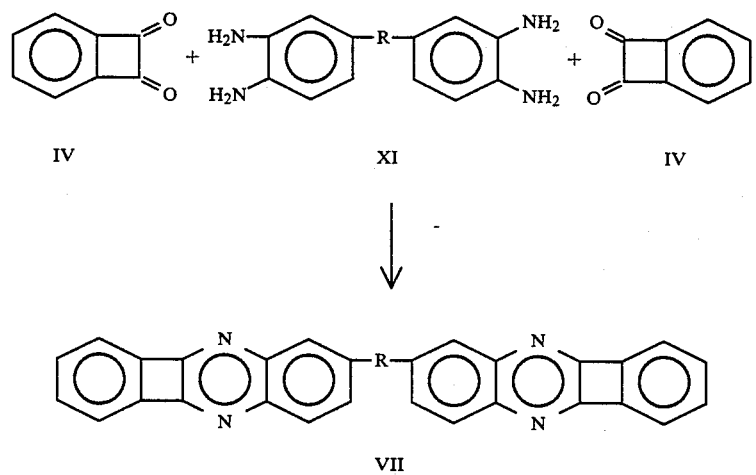

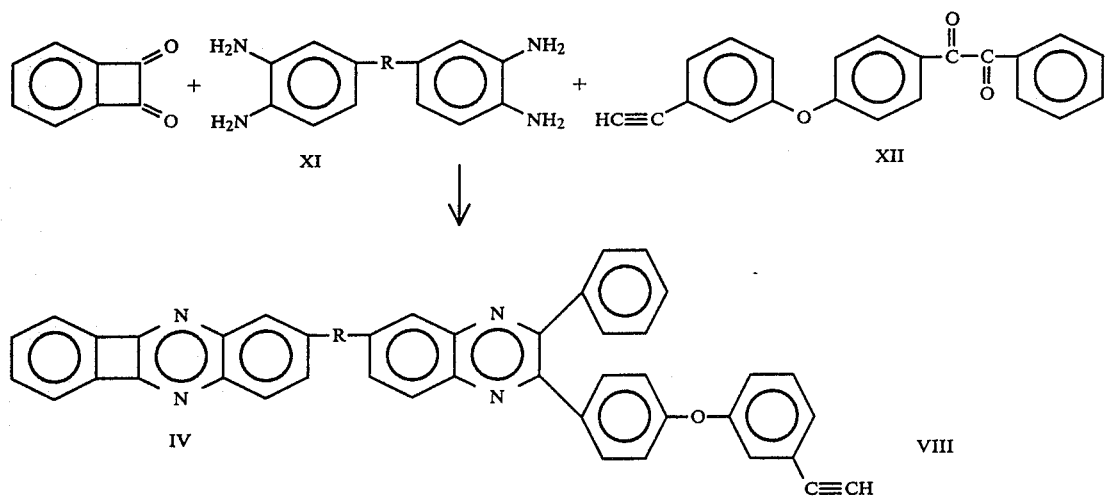

where R is a direct bond, —O—, —S— or

The preparation of this group of polymers is illustrated by a specific synthesis in accordance with the procedure of Example 2 using 2.14 grams of 3,3'-diaminobenzidine (XIA), 1.32 grams of benzocyclobutadienoquinone (IV) and 3.26 grams of 4-(3-ethynylphenoxy)-benzil (XII) in 50 mls. of tetrahydrofuran to produce the product

VIIIA

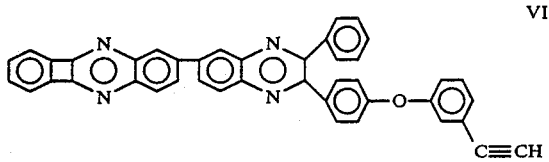

EXAMPLE 4

Preparation of Prepolymers IX

These prepolymers are prepared in accordance with the following reaction

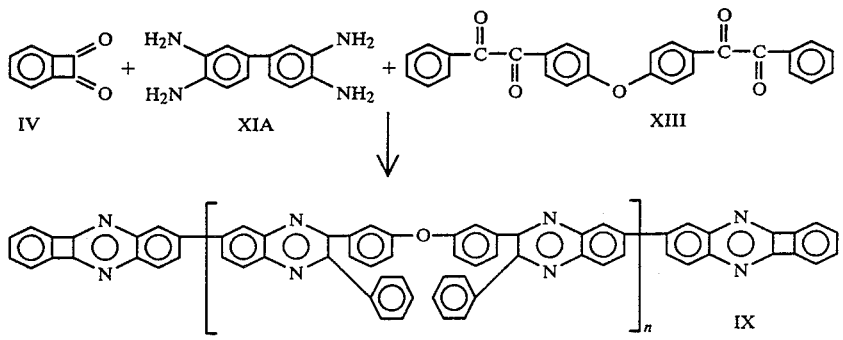

where n is an integer from 1 to 20.

In this example a solution of 3,3'-diaminobenzidine (XIA) (0.82 grams, 0.0038 moles), 4,4'-bis(phenylglyoxaloyl)diphenyl ether (XII) (0.82 grams, 0.00188 moles) and 0.5 mls. acetic acid in 50 mls. tetrahydrofuran was heated to reflux for two hours, and then 0.55 grams (0.0042 moles) of benzocyclobutadienoquinone (IV) was added. After heating for another hour at reflux, the mixture was cooled to room temperature and poured into 200 mls of methanol. The resultant yellow precipitate was suction filtered and washed three times with methanol. The product was redissolved into tetrahydrofuran and precipitated twice from methanol. The yellowish product was then vacuum dried at 50° C. for 24 hours to yield 1.3 grams (60% yield) of oligomer (IX) which is a mixture of products having a varying "n".

EXAMPLE 5

Preparation of Oligomers (X)

The oligomers are prepared in accordance with the reaction:

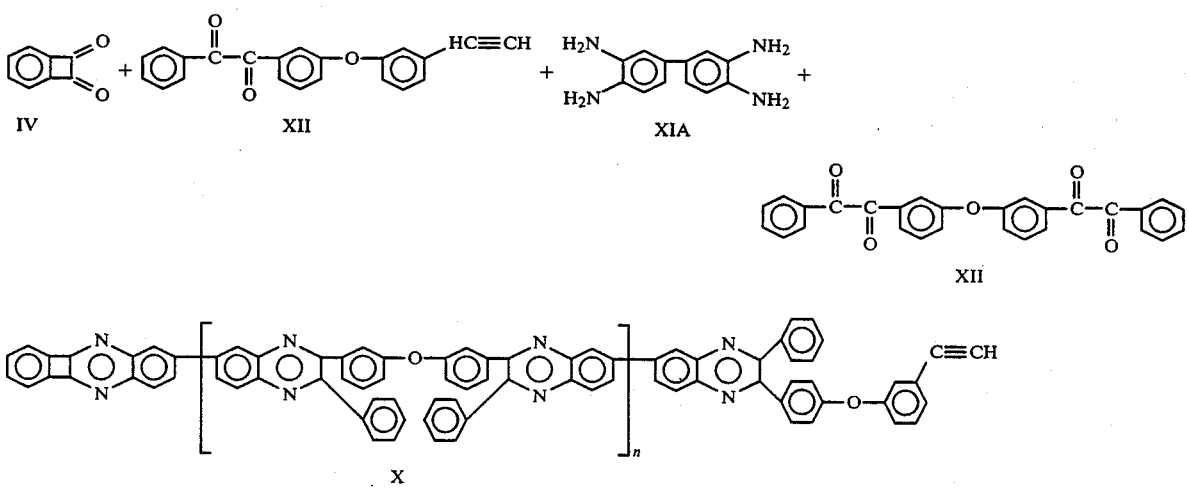

Using a similar procedure as described in Example 4, an oligomer (XA) was prepared with 0.82 grams (0.0038 moles) of 3,3'-diamonobenzidine (XIA), 0.82 grams (0.00188 moles) of 4,4'-bis(phenylglyoxaloyl)diphenyl ether (XII), 0.287 grams (0.0021 moles) of benzocyclobutadienoquinone (IV) and 0.685 grams (0.0021 moles) of 4-(3-ethynylphenoxy)benzil (XII) to give the oligomer (XA).

This invention for convenience will be described in reference to its use in the fabrication of semiconductor devices. Referring to the drawing, there is shown a substrate 1 which is typically monocrystalline silicon, with an overlying layer 2 of a dielectric coating 4, as for example SiO$_2$, Si$_3$N$_4$ or composites thereof, and the like. The substrate 1 in this description is comprehended as an integrated circuit device having active and passive devices fabricated therein (not shown) and means for electrically isolating the devices from each other. For this purpose, the substrate is illustrated with a single doped region 2. In such application, the insulating or dielectric layer 4 is normally provided with contact openings 3 for making contact to the active and passive devices. However, the substrate can also be a body of dielectric material, when the invention is used to form metallurgical patterns on a dielectric module (e.g. alumina ceramics, glass-ceramics, etc) for supporting integrated circuit chips or devices, and appropriate association circuitry.

As shown, the device will include an interconnecting conductor pattern, such as shown at 5, which can be comprised of aluminum deposited by any conventional manner, such as evaporation, which overlies a portion of the dielectric layer 4 and extends therethrough, via access opening 3, to connect with a circuit element or diffused region 2.

Next a layer of one of the prepolymers (VII) to (X) (as for example oligomer (XA)) is coated in a thin layer over the dielectric layer 4 and metallization 5, by means of spinning thereon from a suitable solution, as for example, in a solvent comprised of N-methylpyrrolidone.

Although the amount of the oligomer can vary to some extent, effective solutions can be obtained which contain from about 10 to about 40 weight percent of the oligomer, which can be employed for spin-coating techniques conventionally used for coating resists in the semiconductor industry, or by spray coating techniques. The applied oligomer can effectively have a wet layer thickness in the range of about 10,000 to about 50,000 Å, with the layer thickness depending on the concentration of the prepolymer in solution, and on the rotational speed of the spinner. After application of the prepolymer, it is precured for about 10 to 20 minutes at about 80° to about 100° C. in an inert atmosphere, such as nitrogen, to drive off the solvent.

In the next operation, a thin photoresist layer 8 is applied over the oligomer film 7. The photoresist can comprise any of the conventional resists commercially available in the market. Illustratively it may be a positive resist such as one commercially marketed by the Shipley Company under the designation AZ-1350J, which is comprised of a phenol-formaldehyde resin and a diazonaphthoquinone sensitizer. This resist is also applied by spin-coating techniques, with a typical thickness of about 15,000 Å. After application, the resist can be dried for about 10 minutes at about 80° C. in an inert atmosphere, such as nitrogen.

The photoresist is then exposed by E-Beam techniques or to ultraviolet light through a mask in a pattern corresponding to the pattern of openings desired, as at 10 in the drawing, followed by removal of the exposed portion of the positive resist 8, and the underlying portions of the precured oligomers coating 7, in a two-stage development process.

The resist etch comprises an aqueous tetraalkylammonium hydroxide solution, as for example a 0.237 molar tetramethylammonium hydroxide solution at a pH value of about 13.4. The device is immersed in the solution for sufficient time to remove the exposed portions of the photoresist layer 8 (e.g. 60 seconds for a 15,000 Å thick resist layer). As is known, there is decomposition of the diazonaphthoquinone sensitizer in the exposed areas which renders the resist soluble in an alkaline developer.

In the next step, the bared portions of the precured prepolymer 7, in opening 10, are removed by wet or dry etching techniques, as for example by wet etching in a suitable solvent such as N-methylpyrrolidone, or preferably by dry techniques, such as by an oxygen reactive ion etch.

After etching, the devices are rinsed, dried and the remaining precured prepolymer layer 7 cured at temperatures of the order of 350° to 450° C. for about 30 to about 90 minutes.

While the invention has been illustrated and described with reference to preferred embodiments of this invention, it is to be understood that the invention is not to be limited to the precise construction herein disclosed and the right is reserved to all changes and modifications coming within the scope of the invention as defined in the appended claims.

Having thus described the invention, what is claimed as new, and desired to be secured by Letters Patent is:

1. A method of forming an insulating layer on a surface of a compatible substrate comprising, forming a discrete layer of curable biphenylene end-capped quinoxaline prepolymer on said substrate, and curing coated substrate to polymerize said prepolymer.

2. The method of claim 1 wherein said surface comprises a conductive pattern on said substrate.

3. The method of claim 2 wherein said substrate comprises a dielectric.

4. The method of claim 2 wherein said substrate surface comprises a passivating coating on a semiconductor device having at least one integrated circuit therein.

5. The method of claim 4 wherein said coating has at least one via opening for interconnection of an element of said device to said pattern.

6. The method of claim 1 wherein said substrate comprises a ceramic.

7. The method of claim 1 wherein said substrate comprises a glass-ceramic.

8. The method of claim 1 wherein said prepolymer is selected from the group of:

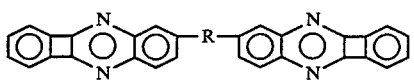  VII

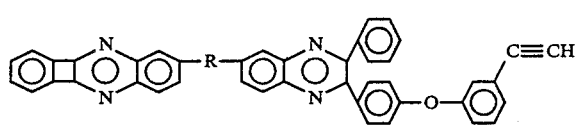  VIII

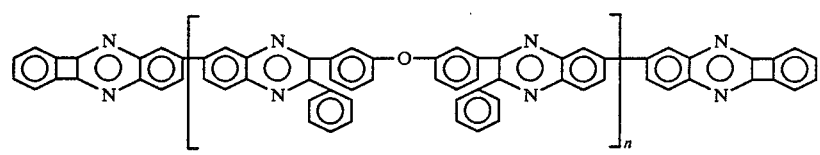  IX

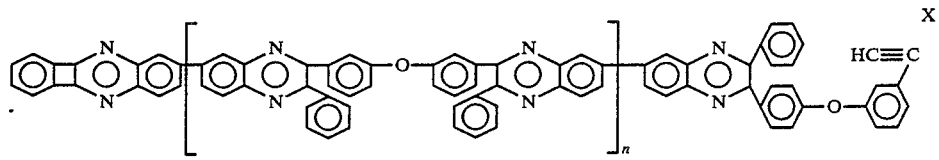  X where R is a direct bond, —O—, —S—, or

and n is an integer from 1 to 20.

9. The method of claim 8 including curing said prepolymer.

* * * * *